(12) United States Patent
Hiroshiro et al.

(10) Patent No.: US 7,998,306 B2
(45) Date of Patent: Aug. 16, 2011

(54) SUBSTRATE PROCESSING APPARATUS

(75) Inventors: Koukichi Hiroshiro, Koshi (JP);
Hideyuki Yamamoto, Tosu (JP);
Kazuhiro Takeshita, Koshi (JP);
Takayuki Toshima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 309 days.

(21) Appl. No.: 12/292,947

(22) Filed: Dec. 1, 2008

(65) Prior Publication Data

US 2009/0139656 A1    Jun. 4, 2009

(30) Foreign Application Priority Data

Dec. 4, 2007   (JP) ................................ 2007-314048

(51) Int. Cl.
*H01L 21/304*    (2006.01)
(52) U.S. Cl. .................... 156/345.11; 134/198; 134/186
(58) Field of Classification Search ............. 156/345.21, 156/345.11, 345; 134/198, 902, 186
See application file for complete search history.

(56) References Cited

U.S. PATENT DOCUMENTS

| 4,995,411 | A | * | 2/1991 | Lowell et al. | ................. 134/198 |
| 5,845,663 | A | * | 12/1998 | Han | ............... 134/155 |
| 2009/0139656 | A1 | * | 6/2009 | Hiroshiro et al. | ........ 156/345.21 |

FOREIGN PATENT DOCUMENTS

JP    2006-179758    7/2006

OTHER PUBLICATIONS

Abiko et al .Machine Generated English Translation of JP2006-179758. Jul. 6, 2006.*

* cited by examiner

*Primary Examiner* — Sylvia R. MacArthur
(74) *Attorney, Agent, or Firm* — Smith, Gambrell & Russell, LLP

(57) ABSTRACT

The present invention provides a substrate processing apparatus for processing substrates by immersing the substrates in a processing liquid. This substrate processing apparatus includes a processing tank having a pair of side walls arranged to be opposed to each other; and a pair of processing-liquid supply mechanisms provided respectively corresponding to the pair of side walls. The pair of processing-liquid supply mechanisms are respectively configured for supplying the processing liquid toward a central portion of the processing tank in the width direction connecting the pair of side walls, thereby to create a rising flow of the processing liquid in a central area in the width direction of the processing tank. Each inner wall face of the pair of side walls includes a main body, a projecting portion located above the main body, and a discharge guide portion located uppermost and providing a discharge port configured for allowing the processing liquid to overflow. The discharge guide portion is inclined upward, opposite to the central portion in the width direction. The projecting portion includes an inner end portion located nearer to the central portion in the width direction, as compared with the main body and discharge guide portion.

14 Claims, 6 Drawing Sheets

SUBSTRATE PROCESSING APPARATUS

CROSS REFERENCE TO RELATED APPLICATIONS

This application is based upon and claims the benefit of priority from the prior Japanese Patent Application No. 2007-314048 filed on Dec. 4, 2007, the entire contents of which are incorporated herein by reference.

BACKGROUND OF THE INVENTION

1. Field of the Invention

The present invention relates to a substrate processing apparatus, in particular to a structure of a processing tank for use in processing a substrate by immersing the substrate in a processing liquid held in the tank.

2. Background Art

In the past, the substrate processing apparatuses have been widely used, for providing various processes, such as etching, cleaning and the like, to a substrate, such as a semiconductor wafer, a glass substrate and the like. As one example of such substrate processing apparatuses, an apparatus has been known, which is configured for providing a process to multiple sheets of substrates, at a time, by storing or accommodating in advance the processing liquid, such as an etching liquid, a cleaning liquid or the like, in the processing tank, and then immersing the multiple sheets of substrates into the processing liquid stored or accommodated in the processing tank while the substrates are supported by a substrate support member.

In such a substrate processing apparatus, a pair of left and right nozzles are provided at a lower portion of the processing tank, while a top end portion of the processing tank is opened. Thus, the processing liquid supplied from each nozzle can overflow from the top end opening of the processing tank.

In this substrate processing apparatus, the processing liquid supplied from the nozzles first flows upward in the processing tank, and then flows toward each of the side walls of the processing tank along the surface of the processing liquid in the vicinity of the top end opening of the processing tank. As a result, a part of the processing liquid overflows an upper edge of each of the side walls of the processing tank and is then discharged from the processing tank. Meanwhile, another part of the processing liquid collides with the upper edge portion of the processing tank and then flows downward into the processing tank along each of the side walls of the tank, without overflowing the upper edge portion.

In the vicinity of the surface of the processing liquid, foreign matter, such as dust coming from the outside of the processing tank, mist of a chemical liquid and the like, may tend to flow in the processing liquid. In addition, in the vicinity of the surface of the processing liquid, the air (or oxygen) present in the atmosphere of the processing tank will be mixed with the processing liquid. Thus, there is a risk that such foreign matter and/or air may be transferred deep into the processing tank, together with the processing liquid that will flow again into the processing tank after flowing along the surface of the liquid in the vicinity of the top end opening of the tank. Such foreign matter may contaminate the substrates, leading to a non-uniform process to the substrates and an unduly lowered processing speed.

To address such problems, one measure, as disclosed in JP2006-179758A, has been known. The entire contents of JP2006-179758A are incorporated herein by reference. In the substrate processing apparatus disclosed in this patent document, as shown in FIG. 6, a pair of left and right nozzles 102, 103 are provided to a lower portion of a processing tank 101, such that the processing liquid supplied from each nozzle 102, 103 can be accommodated in the tank 101. Then, substrates 105 are immersed into the processing liquid while being held by a substrate holding member 104. In this way, a desired process can be provided to the substrates 105. Furthermore, in the substrate processing apparatus disclosed in JP2006-179758A, projecting portions 106, 107, each projecting outward from an upper end portion of the processing tank 101, are provided. This configuration can facilitate discharge of the processing liquid via each projecting portion 106, 107 after the liquid flows along the surface thereof in the vicinity of the top end opening of the processing tank 101.

However, in the substrate processing apparatus disclosed in JP2006-179758A, only the projecting portions 106, 107 are provided to the upper end portion of the processing tank 101. As a result, the processing liquid will flows in the processing tank 101, as schematically shown in FIG. 6. More specifically, as depicted by arrows 108, 109 in FIG. 6, a first part of the processing liquid first flows upward in the processing tank around a central portion, in the lateral direction (substrate-plane direction), of each substrate 105 and then flows from the central portion toward the outside in the lateral direction in the vicinity of the surface of the processing liquid along the surface thereof. In addition, as depicted by arrows 110, 111, 112, 113 in FIG. 6, a second part of the processing liquid first flows upward in the processing tank, laterally outside the central portion of each substrate 105, and then flows slightly below the surface of the processing liquid. In this case, the first part of the processing liquid will collide with the second part of the processing liquid in the vicinity of each projecting portion 106, 107. As a result, backflow or turbulence of the processing liquid is likely to occur around each projecting portion 106, 107.

Therefore, in the substrate processing apparatus according to JP2006-179758A, the first part of the processing liquid that flows from the central portion to the outside in the lateral direction in the vicinity of the surface of the processing liquid along the surface thereof (or the processing liquid that flows as depicted by each arrow 109), i.e., the processing liquid that may capture the foreign matter and/or oxygen in the vicinity of the surface thereof, may tend to be returned deep into the processing tank 101, without being discharged from each projecting portion 106, 107. This may cause contamination of the substrates, non-uniformity of the process and unwanted lowering of the processing speed.

SUMMARY OF THE INVENTION

The substrate processing apparatus according to the present invention is configured for processing a substrate by immersing the substrate in a processing liquid in the apparatus, and comprises: a processing tank having at least a pair of side walls arranged to be opposed to each other; and a pair of processing-liquid supply mechanisms provided respectively corresponding to the pair of side walls, the pair of processing-liquid supply mechanisms being configured to supply the processing liquid into the processing tank, wherein the pair of processing-liquid supply mechanisms are respectively configured to supply the processing liquid toward a central portion of the processing tank in a width direction connecting the pair of side walls so as to create a rising flow of the processing liquid in a central area in the width direction of the processing tank, wherein each inner wall face of the pair of side walls includes a main body, a projecting portion located above the main body, and a discharge guide portion located uppermost and providing a discharge port configured for allowing the processing liquid to overflow, wherein the discharge guide portion is inclined upward, opposite to the central portion in the width direction, and wherein the projecting portion includes an inner end portion located nearer to the central portion in the width direction, as compared with an upper end of the main body and a lower end of the discharge guide portion.

In the substrate processing apparatus of this invention, the inner end portion of the projecting portion may be positioned above an upper end of the substrate when the substrate is contained in the processing tank.

In the substrate processing apparatus of this invention, the projecting portion may include: an inwardly inclined portion, which is inclined upward, toward the central portion in the width direction; and an outwardly inclined portion located above the inwardly inclined portion, the outwardly inclined portion being inclined upward, opposite to the central portion in the width direction.

In the substrate processing apparatus of this invention, the discharge guide portion may be located adjacent to the projecting portion, and the discharge guide portion may extend from an upper end of the outwardly inclined portion of the projecting portion. Additionally, in the substrate processing apparatus of this invention, an angle of inclination of the lower end of the discharge guide portion relative to the width direction may be less than an angle of inclination of the upper end of the outwardly inclined portion of the projecting portion relative to the width direction. Alternatively, in the substrate processing apparatus of this invention, an angle of inclination of the lower end of the discharge guide portion relative to the width direction may be equal to an angle of inclination of the upper end of the outwardly inclined portion of the projecting portion relative to the width direction. Furthermore, in the substrate processing apparatus of this invention, an angle of inclination of the upper end of the outwardly inclined portion of the projecting portion relative to the width direction may be within a range of from 5° to 70°. Additionally, in the substrate processing apparatus of this invention, an angle of inclination of the lower end of the discharge guide portion relative to the width direction may be within the range of from 5° to 70°.

Alternatively, in the substrate processing apparatus of this invention, the projecting portion may be located adjacent to the main body, and the inwardly inclined portion of the projecting portion may extend from the upper end of the main body.

Furthermore, in the substrate processing apparatus of this invention, the projecting portion may further include an intermediate portion located between the inwardly inclined portion and the outwardly inclined portion, the intermediate portion connecting the inwardly inclined portion with the outwardly inclined portion.

Additionally, in the substrate processing apparatus of this invention, the projecting portion may be configured to separate a flow of the processing liquid, which first flows upward, as the rising flow, reaches a top area of the processing tank, and then flows in the width direction from a side of the central portion toward a side of each of the pair of side walls, into a flow of a processing liquid which will be discharged from each discharge port and a flow of a processing liquid which will continue to flow in the processing tank. In the substrate processing apparatus of this invention, the projecting portion may be configured such that the processing liquid that will be discharged from each discharge port flows as the rising flow in an area that is located on an inward side, in the width direction, of an area in which area the processing liquid that will continue to flow in the processing tank flows as the rising flow in the processing tank.

According to the substrate processing apparatus of this invention, each of the side walls of the processing tank includes the main body, the discharge guide portion inclined upward and outward in the width direction and providing the discharge port, and the projecting portion including the inner end portion located inward in the width direction relative to the main body and discharge guide portion. Accordingly, the processing liquid flowing substantially parallel to the surface of the liquid in the top area of the processing tank can be separated, by the projecting portion, into a flow of the processing liquid flowing in the vicinity of the surface of the liquid and another flow of the processing liquid flowing slightly below the surface of the processing liquid.

Therefore, according to the substrate processing apparatus of this invention, occurrence of unwanted backflow and/or turbulence of the flow of the processing liquid around the lower end of each discharge port can be successfully prevented. Thus, the processing liquid flowing in the vicinity of the surface of the liquid can be smoothly discharged from each discharge port, while the processing liquid flowing slightly below the surface of the liquid can be smoothly turned downward into the processing tank. Accordingly, the contamination of the substrates, non-uniformity of the process, unwanted lowering of the processing speed and the like problem can be effectively avoided. Additionally, since the processing liquid can be discharged under adequate control, unduly wasteful discharge of the processing liquid can be significantly prevented.

DESCRIPTION OF THE PREFERRED EMBODIMENTS

Hereinafter, one specific embodiment of the present invention will be described, with reference to the drawings. In the embodiment described below, one exemplary substrate processing apparatus, to which the present invention is applied, for providing an etching process and/or cleaning process to semiconductor wafers (or substrates), will be discussed.

Figure 1:
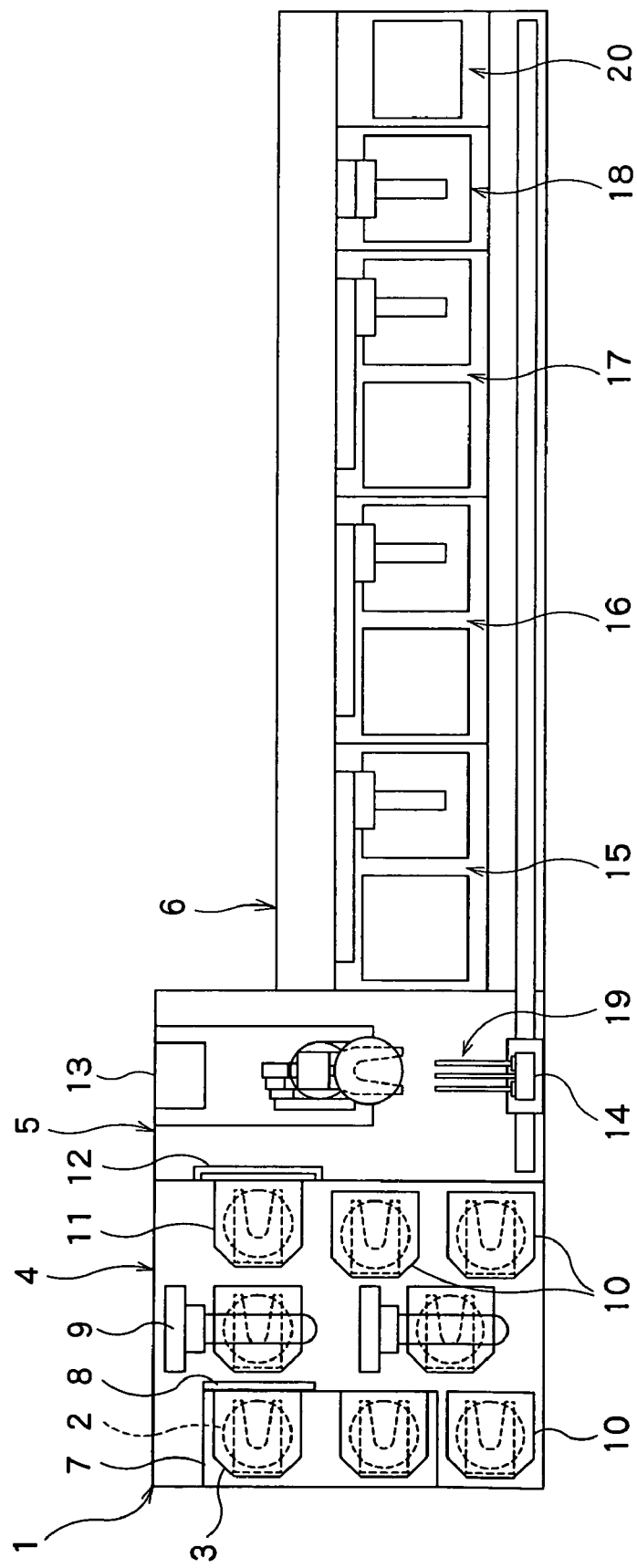
FIG. 1 is a plan view showing one embodiment of the substrate processing apparatus according to the present invention.

As shown in FIG. 1, the substrate processing apparatus 1 includes a carrier transfer part (carrier transfer unit) 4 configured for carrying in and carrying out each carrier 3 containing multiple sheets of semiconductor wafers (hereinafter, referred to as "wafers 2"), a wafer transfer part (wafer transfer unit) 5 configured for carrying in and carrying out each wafer 2 contained in the carrier 3, and a wafer processing part (wafer processing unit) 6 configured for processing the wafers 2.

The carrier transfer part 4 includes a carrier stage 7 on which each carrier 3 is placed. The carrier stage 7 is provided with an opening and closing door 8 that can be hermetically closed. In addition, a carrier transfer mechanism 9, carrier stocks 10 and a carrier table 11 are provided inside the opening and closing door 8.

In the carrier transfer part 4, each carrier 3 once placed on the carrier stage 7 is carried in and transferred to each corresponding carrier stock 10 by the carrier transfer mechanism 9, and is temporarily stored in the carrier stock 10, as needed. Thereafter, the carrier 3 is further transferred to and placed on the carrier table 11. The carrier transfer part 4 is also configured for containing each wafer 2 after the wafer 2 has been subjected to a desired process in the wafer processing part 6. In this case, each carrier 3 once placed on the carrier table 11 is transferred to each corresponding carrier stock 10, along a route reverse to the route upon the carrying-in operation, by the carrier transfer mechanism 9, and is then temporarily stored in the carrier stock 10, as needed. Thereafter, the carrier 3 is carried out onto the carrier stage 7.

Between the wafer transfer part 5 and the carrier transfer part 4, an opening and closing door 12 that can be hermetically closed is provided. In the wafer transfer part 5 located inside the opening and closing door 12, a wafer transfer mechanism 13 and a proximal end of a wafer carrier mechanism 14 are provided.

In the wafer transfer part 5, each wafer 2 contained in the carrier 3 placed on the carrier table 11 in the carried transfer part 4 is transferred to the wafer carrier mechanism 14 by the wafer transfer mechanism 13. Thereafter, the wafer 2 transferred to the wafer carrier mechanism 14 is further carried into the wafer processing part 6 by the wafer carrier mechanism 14. On the other hand, each wafer 2, which has been subjected to the process in the wafer processing part 6, is carried out from the wafer processing part 6 by the wafer carrier mechanism 14, and is then transferred, from the wafer carrier mechanism 14, into the carrier 3 placed on the carrier table 11 of the carrier transfer unit 4, by the wafer transfer mechanism 13.

In the wafer processing part 6, a substrate processing unit (substrate processing apparatus) adapted for processing the wafers and a cleaning machine 20 adapted for cleaning a holder 19 which is attached to the wafer carrier mechanism 14 and which is configured for holding the wafers 2 are provided. In the example shown in the drawings, the substrate processing unit includes first to third wafer cleaning units 15, 16, 17, each adapted for cleaning the wafers 2, and a wafer cleaning and drying unit 18 adapted for cleaning and drying the wafers 2. The wafer carrier mechanism 14 is configured to be optionally moved along a route on which the units 15, 16, 17, 18, 20 are arranged.

Thus, in the wafer processing part 6, the wafers 2 transferred from the wafer transfer part 5 can be carried, by the wafer carrier mechanism 14, into the first to third wafer cleaning units 15, 16, 17 and wafer cleaning and drying unit 18, respectively. Thereafter, the wafers 2, each having been subjected to the cleaning process and/or drying process in each processing unit, are carried back to the wafer transfer unit 5 by the wafer carrier mechanism 14. Furthermore, in the wafer processing part 6, the holder 19 of the wafer carrier mechanism 14 is cleaned in the cleaning machine 20, thereby preventing a contaminant once attached to the holder 19 from being transferred onto each wafer 2.

Next, the substrate processing unit will be described in more detail, with respect to the first to third cleaning units 15, 16, 17 and wafer cleaning and drying unit 18.

Figure 2:
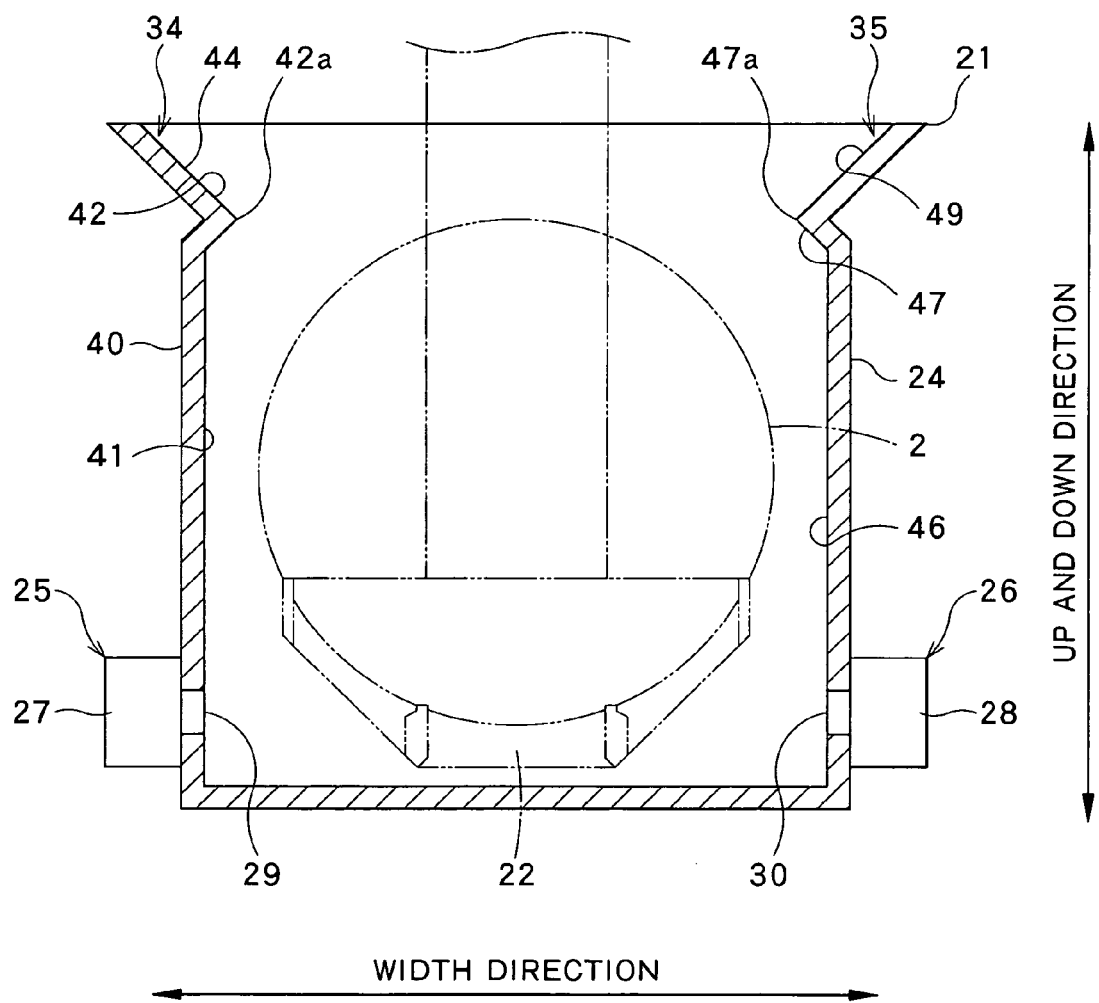
FIG. 2 is a longitudinal cross section of the substrate processing apparatus, showing a front view of the processing tank.
Figure 3:
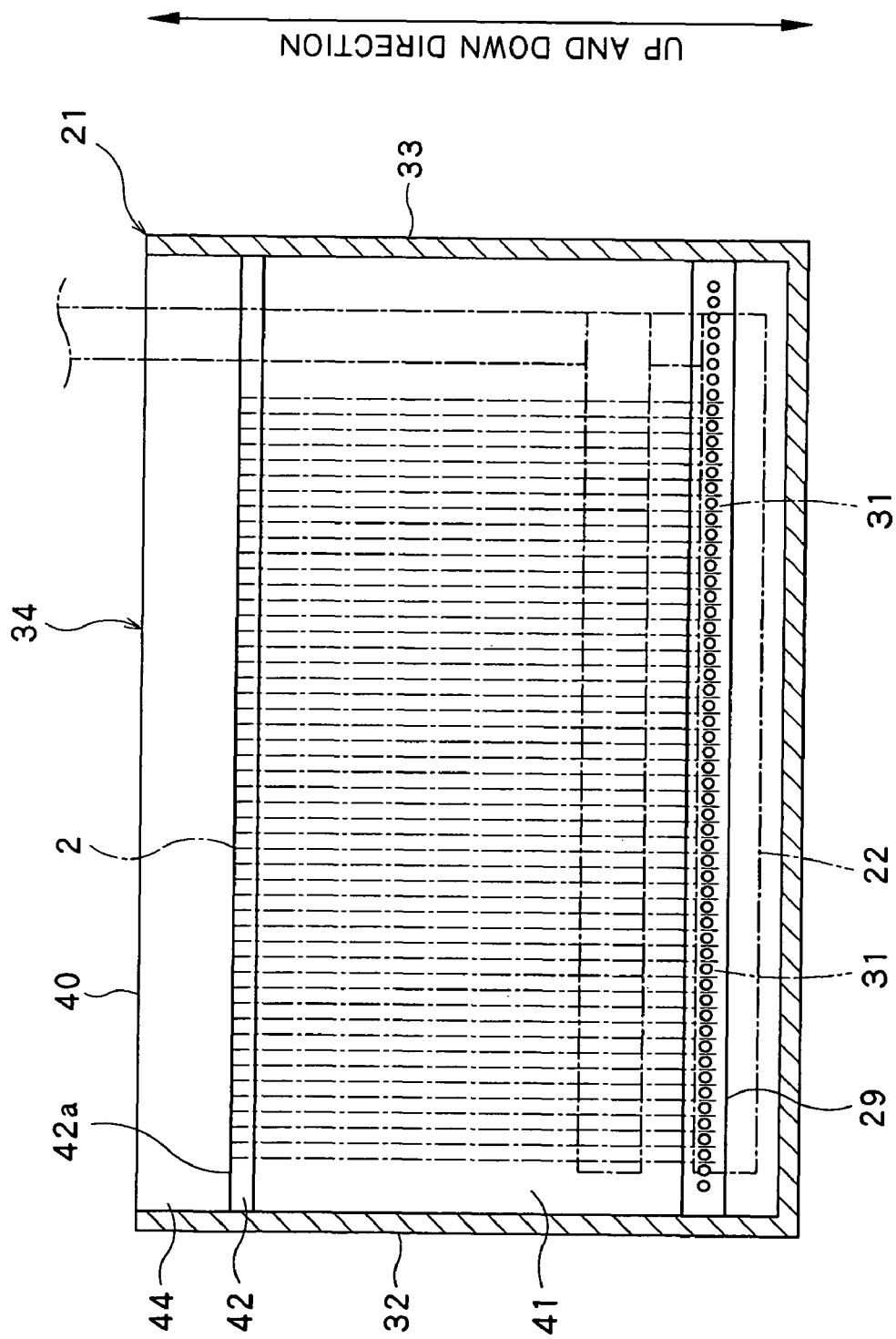
FIG. 3 is a longitudinal cross section of the substrate processing apparatus, showing a side view of the processing tank.

As shown in FIGS. 2 and 3, each of the first to third cleaning units 15, 16, 17 and wafer cleaning and drying unit 18 has a processing tank 21 configured for storing therein a processing liquid, such as an etching liquid, a cleaning liquid and the like, for processing the wafers 2. The processing tank 21 is also configured for containing the wafers 2. In this case, multiple sheets of wafers 2 can be moved, at a time, by a vertically movable wafer holder 22, so that the wafers 2 can be immersed into the processing liquid stored in the processing tank 21. Consequently, the multiple sheets of wafers 22 can be collectively processed.

Each processing tank 21 is formed, from PTFE (polytetrafluoroethylene), into a rectangular parallelepiped shape with an opened top end portion. The processing tank 21 has left and right side walls 40, 45 opposed to each other. To the processing tank 21, the processing liquid is supplied via left and right processing-liquid supply mechanisms (processing-liquid supply members) 25, 26 provided respectively corresponding to the left and right side walls 40, 45. The pair of processing-liquid supply mechanisms 25, 26 are respectively configured for supplying the processing liquid toward a central portion of the processing tank 21, in a width direction (or lateral direction) connecting the pair of side walls 40, 45, i.e. toward a central side in the width direction. In this manner, a rising flow (upward flow) of the processing liquid can be formed in a laterally central area in the width direction of the processing tank 21. It is noted that at least one pair of the processing-liquid supply mechanisms 25, 26 (or supply nozzles 29, 30) may be provided to the left and right side walls of the processing tank 21. For instance, two or more pairs of processing-liquid supply mechanisms 25, 26 may be provided to the left and right side walls of the processing tank 21.

In the example shown in the drawings, the processing-liquid supply mechanisms 25, 26 include processing-liquid supply bodies (processing-liquid supply boxes) 27, 28 provided outside the left and right side walls 40, 45 of the processing tank 21, and the supply nozzles 29, 30 provided inside the left and right side walls 40, 45 of the processing tank 21, respectively. Thus, the processing liquid can be injected into the processing tank 21, from injection ports 31 of the supply nozzles 29, 30, via the processing-liquid supply members 27, 28, respectively.

As shown in FIG. 2, inner wall faces of the left and right side walls 40, 45 of the processing tank 21 include main bodies 41, 46, projecting portions 42, 47 located above the main bodies 41, 46, and discharge guide portions 44, 49, respectively. The discharge guide portions 44, 49 are respectively located uppermost and form discharge ports 34, 35, each configured for allowing the processing liquid to overflow. Each discharge guide portion 44, 49 is inclined upward, opposite to the central portion in the width direction of the processing tank 21. Namely, each discharge guide portion 44, 49 is inclined upward and outward. The projecting portions 42, 47 include inner end portions 42a, 47a located nearer to the central portion in the width direction (or lateral direction), as compared with upper ends (for example, designated by reference numeral 46a in FIGS. 5A through 5D) of the main bodies 41, 46 as well as with lower ends (for example, designated by reference numeral 49a in FIGS. 5A through 5D) of the discharge guide portions 44, 49, respectively.

As shown in FIG. 2, the inner end portions 42a, 47a of the projecting portions 42, 47 are respectively positioned above a top end of each wafer 2 contained in a predetermined position in the processing tank 21. Each projecting portion 40, 45 includes an inwardly inclined portion (for example, designated by reference numeral 48*a* in FIGS. 5A through 5D) inclined upward toward the central portion in the width direction of the processing tank 21, and an outwardly inclined portion (for example, designated by reference numeral 48*b* in FIGS. 5A through 5D) located above the inwardly inclined portion 43*a* and inclined upward, opposite to the central portion in the width direction of the tank 21. Namely, each projecting portion 40, 45 includes the inwardly inclined portion (for example, designated by reference numeral 48*a* in FIGS. 5A through 5D) inclined upward and inward and the outwardly inclined portion (for example, designated by reference numeral 48*b* in FIGS. 5A through 5D) inclined upward and outward.

It is noted that the projecting portions 42, 47 and/or discharge guide portions 44, 49 may be provided to only the left and right side walls 40, 45, or may be provided to only front and rear side walls 32, 33 of the processing tank 21, or otherwise may be provided to all of the left and right side walls 40, 45 and front and rear side walls 32, 33. Similarly, the discharge ports 34, 35 may be provided to only the left and right side walls 40, 45, or may be provided to only the front and rear side walls 32, 33 of the processing tank 21, or otherwise may be provided to all of the left and right side walls 40, 45 and front and rear side walls 32, 33.

Figure 4:
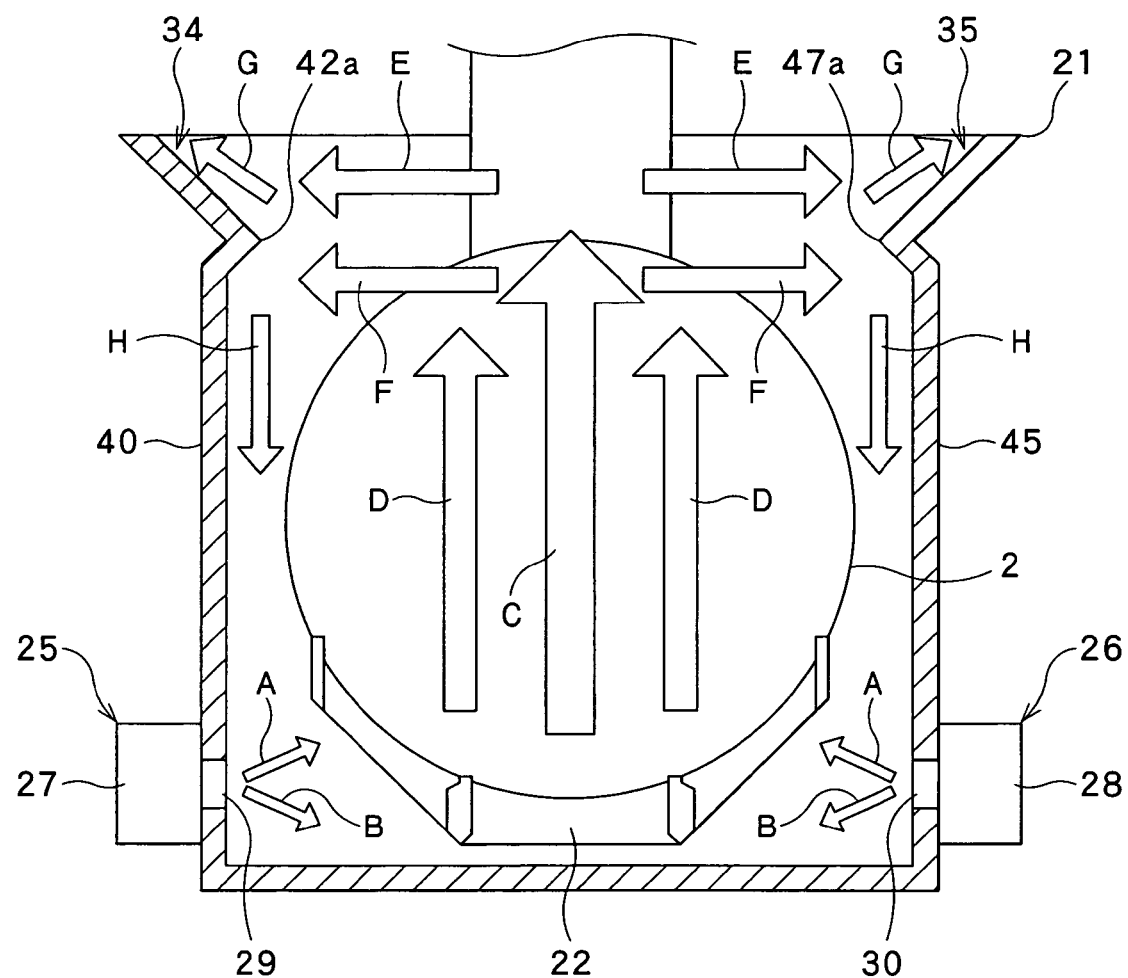
FIG. 4 is a schematic view for explaining a flow of the processing liquid in the processing tank.

As shown in FIG. 4, which is a longitudinal cross section taken along both a width direction connecting the left and right side walls 40, 45 of the processing tank 21 and a up-and-down direction of the processing tank 21 (corresponding to a vertical direction in this embodiment), the processing liquid is injected into the tank 21, upward and downward, from the supply nozzles 29, 30 of the left and right processing-liquid supply mechanisms 25, 26, respectively. In other words, the processing liquid can be supplied inward of the processing tank 21 in the width direction. As a result, flows of the processing liquid, as depicted by arrows A, B, are respectively formed in front of the supply nozzles 29, 30, so that the processing liquid can be supplied toward the central portion in the width direction of the processing tank 21. As a result, in the central area in the width direction of the processing tank 21, a flow of the processing liquid, as depicted by an arrow C, is created, as a rising flow, around a laterally central portion of each wafer 2 contained in the processing tank 21, and another flows of the processing liquid, as depicted by arrows D, are also created, as the rising flow, laterally outside the central portion of the wafer 2. Thereafter, as depicted by arrows E, flows of the processing liquid, which flows laterally (or in the width direction), from the central portion toward the outside, in the vicinity of the surface of the processing liquid along the surface thereof, are created around a top area of the processing tank 21. Furthermore, as depicted by arrows F, another flows of the processing liquid, which flows laterally (or in the width direction), from the central portion toward the outside, slightly below the surface of the processing liquid, are also created.

In the example shown in the drawings, a part of each inner wall face of the left and right side walls 40, 45 of the processing tank 21 is formed from each projecting portion 42, 47. Accordingly, the flows of the processing liquid, which flows laterally from the central portion toward the outside, as depicted by the arrows E and F, will be able to collide with the projecting portions 42, 47, each projecting laterally inward from the left and right side walls 40, 45 at each upper part of the side walls 40, 45. More specifically, as shown in FIG. 4, the processing liquid, which flows in the vicinity of the surface thereof, as depicted by the arrows E, will be able to collide with each outwardly inclined portion (for example, designated by reference numeral 48*b* in FIGS. 5A through 5D) of the inclined projecting portions 42, 47 or the discharge guide portion 44, 49, all of the outwardly inclined portions and the discharge guide portion 44, 49 being located at a portion of each side wall 40, 45 extending above the inner end portions 42*a*, 47*a* and being inclined upwardly and outwardly. Meanwhile, as is also shown in FIG. 4, the processing liquid, which flows slightly below the surface thereof, as depicted by the arrows F, will collide with each inwardly inclined portion (for example, designated by reference numeral 48*a* in FIGS. 5A through 5D) of the inclined projecting portions 42, 47, the inwardly inclined portions being located at a portion of each side wall 40, 45 extending below the inner end portions 42*a*, 47*a* and being inclined downwardly and outwardly (or upwardly and inwardly).

Thus, due to the projecting portions 42, 47, the flow of the supplied or injected processing liquid can be securely separated into the flow of the processing liquid as depicted by the arrows E and the flow of the processing liquid as depicted by the arrows F. Thereafter, the processing liquid flowing as depicted by the arrows E will be guided by each outwardly inclined portion 43*b*, 48*b* of the projecting portions 42, 47 and/or discharge guide portion 44, 49, as depicted by arrows G, and be then discharged to the outside of the processing tank 21 after overflowing from the discharge ports 34, 35. Meanwhile, the processing liquid flowing as depicted by the arrows F will be guided by each inwardly inclined portion 43*a*, 48*a* of the projecting portions 42, 47 and further guided by each main body 41, 46, as depicted by allows H, and be then returned deep into the processing tank 21. The processing liquid returned downwardly in the processing tank 21 will be the rising flow again and flow upward around the laterally central portion of each wafer 2 and/or outside thereof, together with the processing liquid that will be additionally supplied from each supply nozzle 29, 30.

In this way, the projecting portions 42, 47 provided to the processing tank 21 can successfully separate the flow of the processing liquid, which first flows as the rising flow, reaches the top area of the processing tank 21, and then flows in the width direction from the central portion toward each side wall, into two layers of flows, i.e., the flow of the processing liquid flowing laterally in the vicinity of the surface of the processing liquid along the surface thereof and the flow of the processing liquid flowing laterally slightly below the surface of the processing liquid. Namely, each projecting portion 42, 47 can serve as a separator adapted for separating the processing liquid, which first flows as the rising flow and then reaches the top area of the processing tank 21, into the processing liquid which will be discharged from each discharge port 34, 35 and the processing liquid which will returns downward in the processing tank 21.

Therefore, in this processing tank 21, occurrence of backflow and/or turbulence of the processing liquid around a lower end of each discharge port 34, 35 (or lower end of each discharge guide portion 44, 49) can be effectively prevented. Namely, the processing liquid flowing in the vicinity of the surface of the liquid can smoothly overflow each discharge port 34, 35. Meanwhile, the processing liquid flowing below the surface of the liquid can be securely returned downward in the processing tank 21, without wastefully overflowing.

Figure 5A:
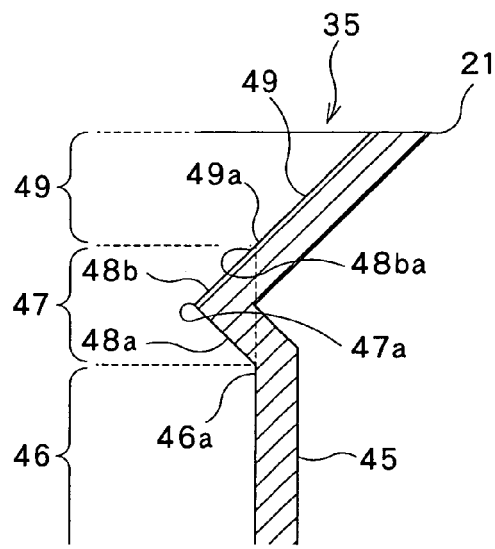
FIG. 5A is a partially enlarged view of FIG. 2, illustrating a construction of the side wall.
Figure 5B:
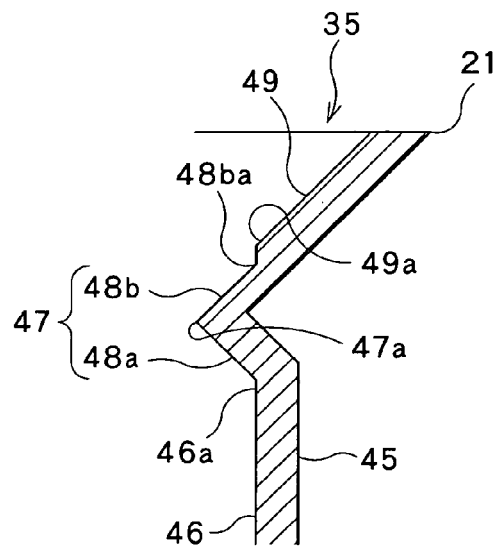
FIG. 5B corresponds to FIG. 5A, illustrating one alteration of a construction of the side.

In the processing tank 21, as shown in FIG. 5A, each discharge guide portion 44, 49 constituting a part of the inner wall face of each side wall 40, 45 is linearly formed, in the cross section taken along both a width direction connecting the left and right side walls 40, 45 of the processing tank 21 and a up-and-down direction of the processing tank 21 (corresponding to a vertical direction in this embodiment). Moreover, each outwardly inclined portion 48b of the projecting portions 42, 47 constituting a part of the inner wall face of each side wall 40, 45 is also linearly formed, in the cross section taken along both a width direction connecting the left and right side walls 40, 45 of the processing tank 21 and a up-and-down direction of the processing tank 21. The discharge guide portions 44, 49 are respectively provided adjacent to the projecting portions 42, 47, wherein each discharge guide portion 44, 49 extends from an upper end (for example, designated by reference numeral 48ba in FIGS. 5A through 5D) of each corresponding outwardly inclined portion 48b of the projecting portions 42, 47. Similarly, the projecting portions 42, 47 are respectively provided adjacent to the main bodies 41, 46, wherein each inwardly inclined portion 43a, 48a of the projecting portions 42, 47 extends from an upper end (for example, designated by reference numeral 46a in FIGS. 5A through 5D) of each corresponding main body 41, 46. However, it should be noted that the construction of the projecting portions 42, 47 and discharge guide portions 44, 49 are not limited to an example as shown in FIG. 5A. For instance, as shown in FIG. 5B, each side wall 40, 45 may include a linear portion provided between each corresponding discharge guide portion 44, 49 and each corresponding projecting portion 42, 47. Alternatively, at least one of the discharge guide portions 44, 49 and outwardly inclined portions 48b of the projecting portions 42, 47 may be formed into a curved shape. It should be appreciated that, if the lower end (for example, designated by reference numeral 49a in FIGS. 5A through 5D) of each discharge guide portion 44, 49 and the upper end (for example, designated by reference numeral 48ba in FIGS. 5A through 5D) of each outwardly inclined portion 48b of the projecting portions 42, 47 are provided to be adjacent to each other and continuous with each other, the processing liquid can flow quite smoothly between each outwardly inclined portion 48b of the projecting portions 42, 47 and each corresponding discharge guide portion 44, 49.

Figure 5C:
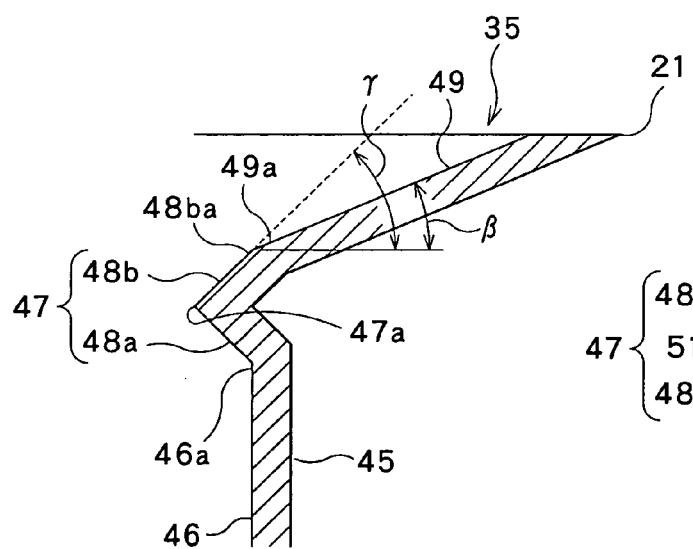
FIG. 5C corresponds to FIG. 5A, illustrating another alteration of a construction of the side.

In the example shown in FIG. 5A, each outwardly inclined portion 48b of the projecting portions 42, 47 and each corresponding discharge guide portion 44, 49 are formed together into a linear shape. Namely, in the cross section taken along both a width direction connecting the left and right side walls 40, 45 of the processing tank 21 and a up-and-down direction of the processing tank 21, an angle of inclination of the lower end (for example, designated by reference numeral 49a in FIGS. 5A through 5D) of each discharge guide portion 44, 49 relative to the width direction (or horizontal direction in this embodiment) is equal to the angle of inclination of the upper end (for example, designated by reference numeral 48ba in FIGS. 5A through 5D) of each outwardly inclined portion 48b of the projecting portions 42, 47 relative to the width direction (or horizontal direction in this embodiment). With such an aspect, the processing liquid can flows quite smoothly between each outwardly inclined portion 43b, 48b of the projecting portions 42, 47 and each corresponding discharge guide portion 44, 49. However, as shown in FIG. 5C, the lower end 49a of each discharge guide portion 44, 49 may be connected, non-linearly, with the upper end 48ba of each corresponding outwardly inclined portion 48b of the projecting portions 42, 47. In an example shown in FIG. 5C, when seen in the cross section taken along both a width direction connecting the left and right side walls 40, 45 of the processing tank 21 and a up-and-down direction of the processing tank 21, the angle (β) of inclination of the lower end 49a of each discharge guide portion 44, 49 relative to the width direction (or horizontal direction in this embodiment) is less than the angle (γ) of inclination of the upper end 48ba of each outwardly inclined portion 48b of the projecting portions 42, 47 relative to the width direction (or horizontal direction in this embodiment). Namely, each connection point between the discharge guide portions 44, 49 and the outwardly inclined portions 48b of the projecting portions 42, 47 projects toward the inside of the processing tank 21. However, in such an example as shown in FIG. 5C, the processing liquid can also flow quite smoothly between each outwardly inclined portion 48b of the projecting portions 42, 47 and each corresponding discharge guide portion 44, 49.

Figure 5D:
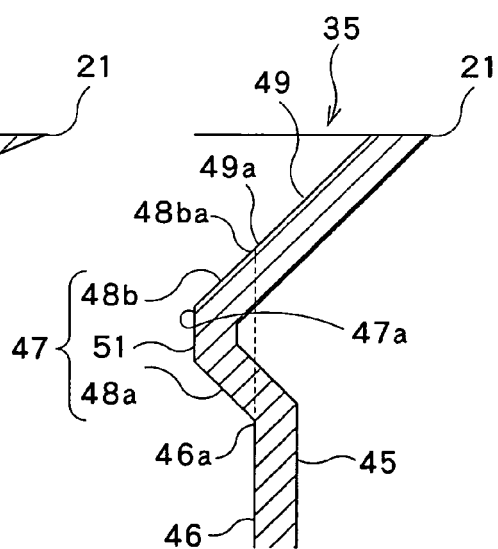
FIG. 5D corresponds to FIG. 5A, illustrating still another alteration of a construction of the side.
Figure 6:
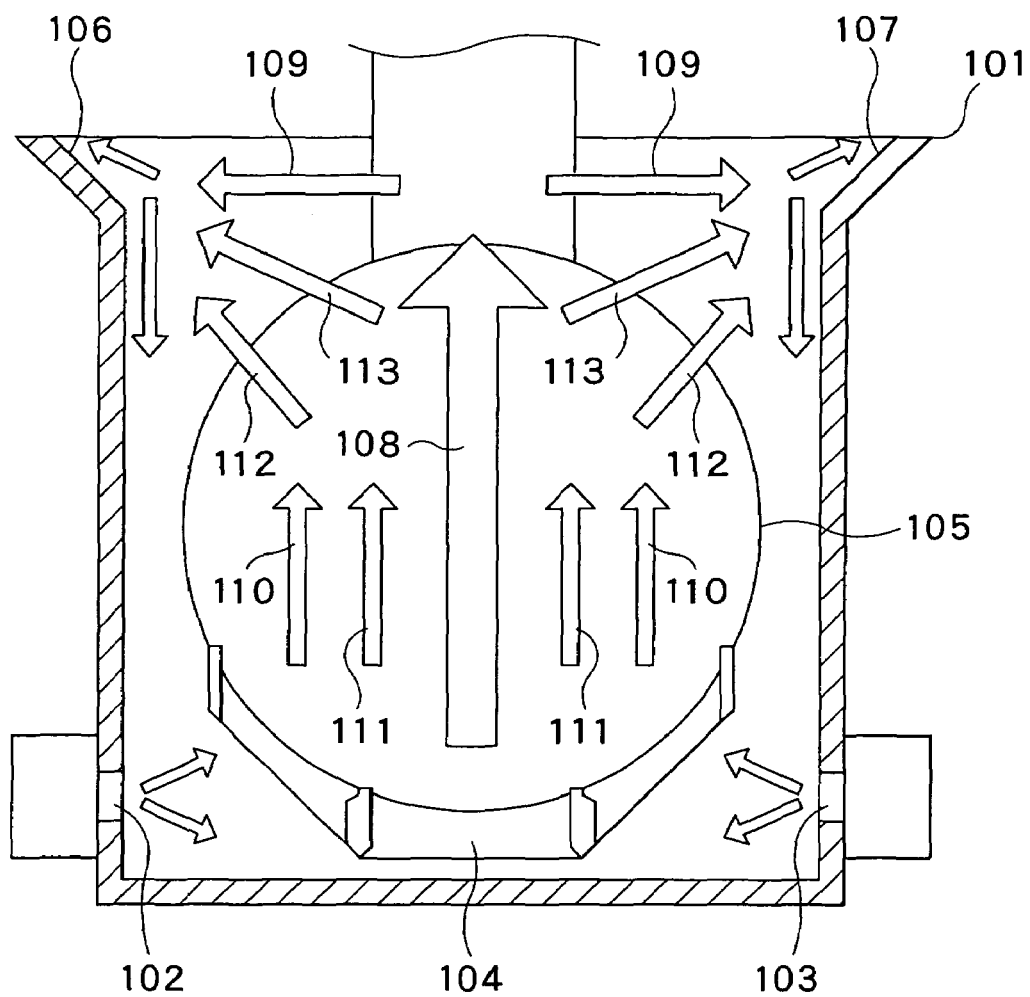
FIG. 6 corresponds to FIG. 4, illustrating a flow of the processing liquid in a conventional processing tank.

In the example shown in FIG. 5A, each inwardly inclined portion 48a of the projecting portions 42, 47 is located adjacent to each corresponding outwardly inclined portion 48b, and each inner end portion 42a, 47a is formed by an intersection point between each inwardly inclined portion 48a and each corresponding outwardly inclined portion 48b. However, as shown in FIG. 5D, each projecting portion 42, 47 may include an intermediate portion 51, the intermediate portion 51 being located between each inwardly inclined portion 48a and each corresponding outwardly inclined portion 48b and connecting the inwardly inclined portion 48a with the corresponding outwardly inclined portion 48b. As described above, FIG. 5A shows one example in which the inwardly inclined portions 48a and outwardly inclined portions 48b are linearly formed, respectively, in the cross section taken along both a width direction connecting the left and right side walls 40, 45 of the processing tank 21 and a up-and-down direction of the processing tank 21. However, it is noted that at least one of the inwardly inclined portions 48a and outwardly inclined portions 48b may be formed into a curved shape. Furthermore, FIG. 5A shows the example in which the main bodies 41, 46 are linearly formed, respectively, in the cross section taken along both a width direction connecting the left and right side walls 40, 45 of the processing tank 21 and a up-and-down direction of the processing tank 21. However, the main bodies 41, 46 may be formed into a curved shape.

In the example shown in FIG. 5C, when seen in the cross section taken along both a width direction connecting the left and right side walls 40, 45 of the processing tank 21 and a up-and-down direction of the processing tank 21, the angle β of inclination, at the lower end (for example, designated by reference numeral 49a in FIGS. 5A through 5D), of each discharge guide portion 44, 49 relative to the width direction (or horizontal direction in this embodiment) of the processing tank 21 is preferably within a range of from 5° to 70°. Furthermore, when seen in the cross section taken along both a width direction connecting the left and right side walls 40, 45 of the processing tank 21, it is preferred that the angle (γ) of inclination, at the upper end (for example, designated by reference numeral 48ba in FIGS. 5A through 5D), of each outwardly inclined portion 48b of the projecting portions 42, 47 relative to the width direction (or horizontal direction in this embodiment) of the processing tank 21, is within the range of from 5° to 70°. If these angles β, γ are less than 5°, an unduly large amount of the processing liquid may tend to be discharged via the discharge ports 34, 35. Contrary, if the angles β, γ are greater than 70°, the backflow and/or turbulence of the processing liquid may be likely to occur. It is preferred that each upper end of the side walls 40, 45, at which each discharge port 34, 35 is provided, is positioned inside in the horizontal direction relative to each corresponding processing-liquid supply mechanism 25, 26 (or processing-liquid supply body 27, 28) provided to project outward from the side walls 40, 45 of the processing tank 21. With such configuration, although the provision of the discharge ports 34, 35 to the processing tank 21 make the volume of the processing tank 21 increase, the provision of the discharge ports 34, 35 will not make installation area (or footprint) of the substrate processing units, such as wafer cleaning units 15, 16, 17, wafer cleaning and drying unit 18, and the like increase.

As described above, the substrate processing apparatus 1 includes the processing tank 21 having the pair of side walls 40, 45 arranged to be opposed to each other, and the pair of processing-liquid supply mechanisms 25, 26 provided respectively corresponding to the pair of side walls 40, 45 and adapted for supplying the processing liquid into the processing tank 21. The pair of processing-liquid supply mechanisms 25, 26 are respectively configured for supplying the processing liquid toward the central side of the processing tank 21 in the width direction connecting the pair of side walls 40, 45 such that the rising flow of the processing liquid is formed in the laterally central area of the processing tank 21. The inner wall faces of the pair of side walls 40, 45 include, respectively, the main bodies 41, 46, projecting portions 42, 47 located above the main bodies 41, 46, and discharge guide portions 44, 49 located uppermost and providing the discharge ports 34, 35, each the discharge port 34, 35 being configured for allowing the processing liquid to overflow. The discharge guide portions 44, 49 are inclined upward, opposite to the central portion in the width direction, respectively. The projecting portions 42, 47 include the inner end portions 42a, 47a located nearer to the central portion in the width direction, as compared with the upper ends (for example, designated by reference numeral 46a in FIGS. 5A through 5D) of the main bodies 41, 46 and the lower ends (for example, designated by reference numeral 49a in FIGS. 5A through 5D) of the discharge guide portions 44, 49, respectively.

Therefore, in the substrate processing apparatus 1, each projecting portion 42, 47 provided to the processing tank 21 can serve as a separator (or separating member) configured for separating the flow of the processing liquid, which first flows as the rising flow, reaches the top area of the processing tank 21, and then flows in the width direction from the side of the central portion (or inside) toward the side of each side wall 40, 45 (or outside), into the flow of the processing liquid which will be discharged from each discharge port 34, 35 and the flow of the processing liquid which will continue to flow in the processing tank 21. Especially, each projecting portion 42, 47 is configured for separating the flow of the processing liquid, which first flows upward around the central portion of each wafer 2, then flows in the vicinity of the surface of the liquid and thereafter discharged from each discharge port 34, 35, from the flow of the processing liquid, which first flows upward, laterally outside the central portion of the wafer 2, then flows downward along each side wall 40, 45 of the processing tank 21 and thereafter flows in the processing tank 21.

Thus, in the substrate processing apparatus 1 described above, no turbulence and/or backflow of the processing liquid will occur around the lower ends (for example, designated by reference numeral 49a in FIGS. 5A through 5D) of the discharge guide portions 44, 49 respectively providing the discharge ports 34, 35. Therefore, the processing liquid which flows in the vicinity of the surface of the liquid (or processing liquid in which the foreign matter and/or oxygen is likely to be incorporated from above the processing tank 21) can be smoothly discharged from the discharge ports 34, 35. Besides, the processing liquid which flows below the surface of the liquid (or processing liquid in which no foreign matter and oxygen is incorporated) can be effectively turned downward in the processing tank 21.

Accordingly, the contamination and non-uniform process to the wafers 2 and unwanted lowering of the processing speed can be avoided, without wastefully discharging the processing liquid.

The invention claimed is:

1. A substrate processing apparatus for processing a substrate by immersing the substrate in a processing liquid in the apparatus, comprising:
    a processing tank having at least a pair of side walls arranged to be opposed to each other; and
    a pair of processing-liquid supply mechanisms provided respectively corresponding to the pair of side walls, the pair of processing-liquid supply mechanisms being configured to supply the processing liquid into the processing tank,
    wherein the pair of processing-liquid supply mechanisms are respectively configured to supply the processing liquid toward a central portion of the processing tank in a width direction connecting the pair of side walls, and
    wherein each of the side walls has:
    a main wall;
    a first inclined wall connected to an upper end of the main wall and inclined upward, toward the central portion in the width direction; and
    a second inclined wall located above the first inclined wall and inclined upward, opposite to the central portion in the width direction.

2. The substrate processing apparatus according to claim 1,
    wherein an inner wall face of each side wall of the pair of side walls includes a main body, a projecting portion located above the main body, and a discharge guide portion located uppermost and providing a discharge port configured for allowing the processing liquid to overflow,
    wherein the discharge guide portion is inclined upward, opposite to the central portion in the width direction, and
    wherein the projecting portion includes an inner end portion located nearer to the central portion in the width direction, as compared with an upper end of the main body and a lower end of the discharge guide portion.

3. The substrate processing apparatus according to claim 2, wherein the projecting portion includes:
    an inwardly inclined portion, which is inclined upward, toward the central portion in the width direction; and
    an outwardly inclined portion located above the inwardly inclined portion, the outwardly inclined portion being inclined upward, opposite to the central portion in the width direction.

4. The substrate processing apparatus according to claim 3,
    wherein the discharge guide portion is located adjacent to the projecting portion, and
    wherein the discharge guide portion extends from an upper end of the outwardly inclined portion of the projecting portion.

5. The substrate processing apparatus according to claim 4,
    wherein an angle of inclination of the lower end of the discharge guide portion relative to the width direction is less than an angle of inclination of the upper end of the outwardly inclined portion of the projecting portion relative to the width direction.

6. The substrate processing apparatus according to claim 4,
    wherein an angle of inclination of the lower end of the discharge guide portion relative to the width direction is equal to an angle of inclination of the upper end of the outwardly inclined portion of the projecting portion relative to the width direction.

7. The substrate processing apparatus according to claim 4,
    wherein an angle of inclination of the upper end of the outwardly inclined portion of the projecting portion relative to the width direction is within a range of from 5° to 70°.

8. The substrate processing apparatus according to claim 4, wherein an angle of inclination of the lower end of the discharge guide portion relative to the width direction is within the range of from 5° to 70°.

9. The substrate processing apparatus according to claim 3, wherein the projecting portion is located adjacent to the main body, and
wherein the inwardly inclined portion of the projecting portion extends from the upper end of the main body.

10. The substrate processing apparatus according to claim 3,
wherein the projecting portion further includes an intermediate portion located between the inwardly inclined portion and the outwardly inclined portion, the intermediate portion connecting the inwardly inclined portion with the outwardly inclined portion.

11. The substrate processing apparatus according to claim 2,
wherein the projecting portion is configured to separate a flow of the processing liquid, which first flows upward, as a rising flow, reaches a top area of the processing tank, and then flows in the width direction from a side of the central portion toward a side of each of the pair of side walls, into a flow of a processing liquid which will be discharged from each discharge port and a flow of a processing liquid which will continue to flow in the processing tank.

12. The substrate processing apparatus according to claim 11,
wherein the projecting portion is configured such that the processing liquid that will be discharged from each discharge port flows as the rising flow in an area that is located on an inward side, in the width direction, of an area in which area the processing liquid that will continue to flow in the processing tank flows as the rising flow in the processing tank.

13. The substrate processing apparatus according to claim 2, wherein the inner end portion of the projecting portion is positioned above an upper end of the substrate when the substrate is contained in the processing tank.

14. The substrate processing apparatus according to claim 2,
wherein the second inclined wall includes a lower part connected to the upper end of the first inclined wall, and an upper part connected to an upper end of the lower part,
wherein the main body is formed by the main wall,
wherein the projecting portion is formed by the first inclined wall and the lower part of the second inclined wall, and
wherein the discharge guide portion is formed by the upper part of the second inclined wall.

* * * * *